(12) United States Patent
Fukuda et al.

(10) Patent No.: US 11,815,422 B2
(45) Date of Patent: Nov. 14, 2023

(54) OPTICAL TEST CIRCUIT

(71) Applicant: Nippon Telegraph and Telephone Corporation, Tokyo (JP)

(72) Inventors: Hiroshi Fukuda, Tokyo (JP); Toru Miura, Tokyo (JP); Yoshiho Maeda, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 260 days.

(21) Appl. No.: 17/418,720

(22) PCT Filed: Dec. 13, 2019

(86) PCT No.: PCT/JP2019/048936
§ 371 (c)(1),
(2) Date: Jun. 25, 2021

(87) PCT Pub. No.: WO2020/137621
PCT Pub. Date: Jul. 2, 2020

(65) Prior Publication Data
US 2022/0042877 A1 Feb. 10, 2022

(30) Foreign Application Priority Data
Dec. 28, 2018 (JP) ................. 2018-247270

(51) Int. Cl.
*G01M 11/00* (2006.01)
*G02B 6/12* (2006.01)
(Continued)

(52) U.S. Cl.
CPC ......... *G01M 11/33* (2013.01); *G02B 6/12007* (2013.01); *H01L 31/028* (2013.01);
(Continued)

(58) Field of Classification Search
None
See application file for complete search history.

(56) References Cited

U.S. PATENT DOCUMENTS

| 9,577,136 B2 | 2/2017 | Okumura | |
| 2013/0039615 A1* | 2/2013 | Nguyen | G02B 6/12002 257/E31.127 |

(Continued)

FOREIGN PATENT DOCUMENTS

| JP | 2018101004 A | 6/2018 |
| WO | 2014171005 A1 | 10/2014 |

OTHER PUBLICATIONS

Sun, X et al., "Room-temperature direct bandgap electroluminesence from Ge-on-Si light-emitting diodes," Optics etters, vol. 34, No. 8, Apr. 15, 2009, 3 pages.

*Primary Examiner* — Chad H Smith
(74) *Attorney, Agent, or Firm* — Slater Matsil, LLP

(57) ABSTRACT

An embodiment optical test circuit includes a first optical circuit and a second optical circuit formed on a substrate, an input optical waveguide optically connected to the first optical circuit and the second optical circuit, and an output optical waveguide optically connected to the first optical circuit and the second optical circuit. The optical test circuit also includes a light emitting diode optically connected to the input optical waveguide, and a photodiode optically connected to the output optical waveguide.

8 Claims, 5 Drawing Sheets

(51) Int. Cl.
*H01L 31/0232* (2014.01)
*H01L 31/028* (2006.01)
*H01L 33/34* (2010.01)

(52) U.S. Cl.
CPC ........ *H01L 31/02327* (2013.01); *H01L 33/34* (2013.01); *G02B 2006/12061* (2013.01); *G02B 2006/12123* (2013.01); *G02B 2006/12126* (2013.01)

(56) References Cited

U.S. PATENT DOCUMENTS

2015/0214122 A1 7/2015 Vermeulen et al.
2018/0172904 A1 6/2018 Sugama

\* cited by examiner

OPTICAL TEST CIRCUIT

CROSS-REFERENCE TO RELATED APPLICATIONS

This patent application is a national phase filing under section 371 of PCT/JP2019/048936, filed Dec. 13, 2019, which claims the priority of Japanese patent application no. 2018-247270, filed Dec. 28, 2018, each of which is incorporated herein by reference in its entirety.

TECHNICAL FIELD

The present invention relates to an optical test circuit for testing an optical circuit.

BACKGROUND

In testing an optical circuit, the response of the optical circuit to light beams that have been input thereto is measured. The wafer-level test has been proposed as a technique of this type (see Patent Literature 1). On the other hand, for the purpose of economization of devices, silicon photonics devices are attracting attention for the optical circuit. Introducing silicon photonics allows reducing manufacturing costs. However, to radically reduce the costs, reduction in testing costs is necessary, and advances in the wafer-level test of the optical circuit are required.

CITATION LIST

Patent Literature

Patent Literature 1: U.S. Patent Application Publication No. 2015/0214122.

SUMMARY

Technical Problem

In the wafer-level test, the time required for light introduced from an optical fiber into an optical circuit makes it difficult to radically reduce the price. To reduce this time, an element serving as a light source may be integrated on the wafer on which the optical circuit is formed. However, the element serving as a light source is generally composed of a direct-transition type compound semiconductor, and thus integrally forming the element on the silicon wafer has a technical challenge in itself. Conventionally, there is a problem such that it is not easy to reduce the time required for the wafer-level test of the optical circuit.

Embodiments of the present invention is made to solve the above problem. It is an object of embodiments of the present invention to reduce the time required for a wafer-level test of an optical circuit.

Means for Solving the Problem

An optical test circuit according to embodiments of the present invention includes: an optical circuit that includes an optical waveguide formed on a substrate and having a core made of silicon; a first optical waveguide that includes an optical waveguide having a core made of silicon and that is optically connected to the optical circuit; a second optical waveguide that includes an optical waveguide having a core made of silicon and that is optically connected to the optical circuit; a light emitting diode that is optically connected to the first optical waveguide and that has an active layer made of germanium; and a photodiode that is optically connected to the second optical waveguide and that has an optical absorption layer made of germanium.

In an exemplary configuration of the above optical test circuit, the optical test circuit includes a first silicon layer that is formed on the substrate and that is continuous with the core of the first optical waveguide. The active layer is formed on the first silicon layer.

In an exemplary configuration of the above optical test circuit, the light emitting diode has: a first region of a first conductivity type, which is formed in the first silicon layer; the active layer; and a first semiconductor layer of a second conductivity type, which is formed on the active layer. The active layer is formed on the first region.

In an exemplary configuration of the above optical test circuit, the first semiconductor layer includes germanium of the second conductivity type.

In an exemplary configuration of the above optical test circuit, the optical test circuit includes a second silicon layer that is formed on the substrate and that is continuous with the core of the second optical waveguide. The optical absorption layer is formed on the second silicon layer.

In an exemplary configuration of the above optical test circuit, the photodiode has: a second region of the first conductivity type, which is formed in the second silicon layer; the optical absorption layer; and a second semiconductor layer of the second conductivity type, which is formed on the optical absorption layer. The optical absorption layer is formed on the second region.

In an exemplary configuration of the optical test circuit, the optical absorption layer includes germanium.

In an exemplary configuration of the optical test circuit, the second semiconductor layer includes germanium of the second conductivity type.

Effects of Embodiments of the Invention

As described above, according to embodiments of the present invention, the light emitting diode with the active layer made of germanium is optically connected to the first optical waveguide, and the photodiode is optically connected to the second optical waveguide. Consequently, light introduction from an optical fiber into an optical circuit is eliminated, and thus the time required for the wafer-level test of the optical circuit can be reduced.

DETAILED DESCRIPTION OF ILLUSTRATIVE EMBODIMENTS

Optical test circuits according to embodiments of the present invention will be described below.

First Embodiment

Figure 1:
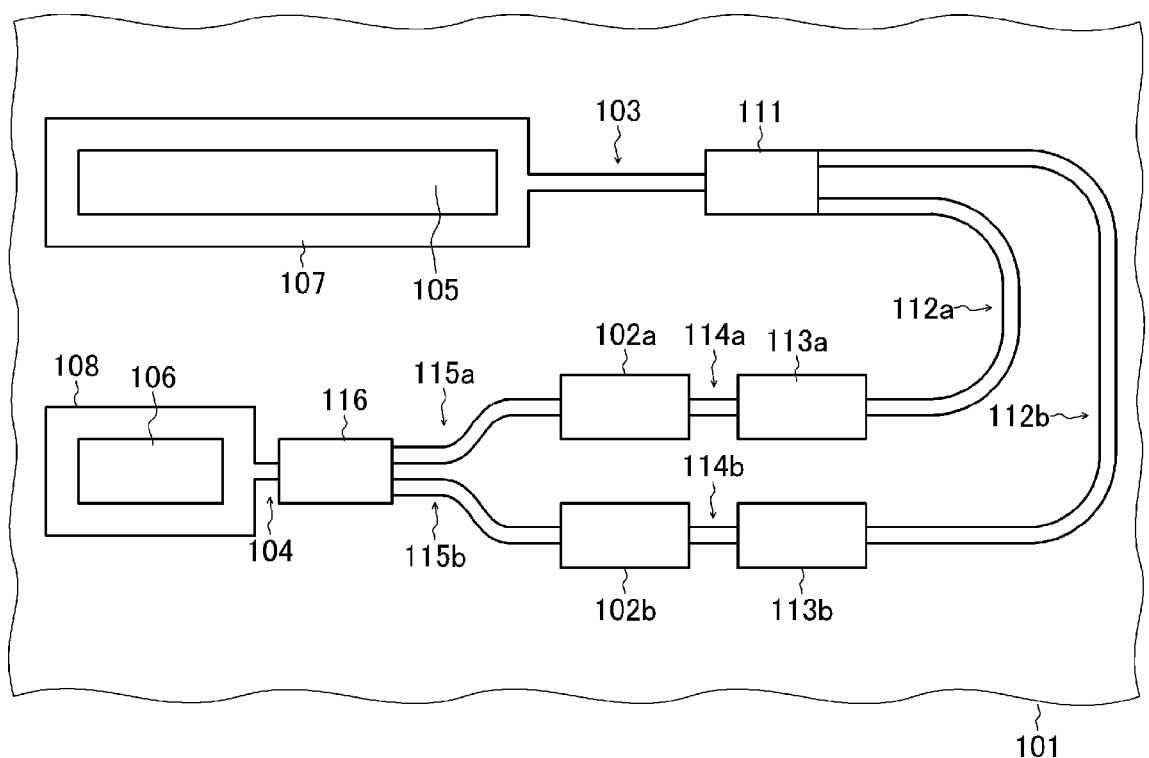
FIG. 1 is a configuration diagram showing a configuration of an optical test circuit according to the first embodiment of the present invention.

To begin, an optical test circuit according to the first embodiment of the present invention is described with reference to FIG. 1, FIG. 2A, and FIG. 2B. This optical test circuit includes an optical circuit 102*a* and an optical circuit 102*b* formed on a substrate 101, a first optical waveguide 103 optically connected to the optical circuit 102*a* and the optical circuit 102*b*, and a second optical waveguide 104 optically connected to the optical circuit 102*a* and the optical circuit 102*b*. In the optical test circuit according to the embodiment, the first optical waveguide 103 and the second optical waveguide 104 are also formed on the substrate 101.

Each of the optical circuit iota, the optical circuit 102*b*, the first optical waveguide 103, and the second optical waveguide 104 includes, for example, a rib-type optical waveguide which is formed on the substrate 101 and has a core made of silicon. For example, the substrate 101 is a well-known SOI (silicon on insulator) substrate, and includes an embedded insulation layer 212 on a base portion 211 thereof. Forming the above-mentioned cores in the surface silicon layer of this SOI substrate can provide the optical waveguides of the optical circuit 102*a*, the optical circuit 102*b*, the first optical waveguide 103, and the second optical waveguide 104.

The light beams input to the first optical waveguide 103 are branched to an optical waveguide 112*a* and an optical waveguide 112*b* by an optical branch circuit 111. The respective branched light beams pass through an optical attenuator 113*a* and an optical attenuator 113*b*, and then through an optical waveguide 114*a* and an optical waveguide 114*b*, and are input to the optical circuit 102*a* and the optical circuit 102*b*. The light beams output from the optical circuit 102*a* and the optical circuit 102*b* pass through an optical waveguide 115*a* and an optical waveguide 115*b* respectively, and are multiplexed by an optical multiplex circuit 116. The multiplexed light beam is then output from the second optical waveguide 104.

The optical circuit 102*a* and the optical circuit 102*b* are two optical waveguides having different lengths from each other, for example. Each of the optical branch circuit 111 and the optical multiplex circuit 116 can include, for example, a multi-mode interferometer or a directional coupler. The cores of the optical circuit 102*a*, the optical circuit 102*b*, the optical branch circuit 111, the optical attenuator 113*a*, the optical attenuator 113*b*, and the above-mentioned optical waveguides can be formed by patterning the surface silicon layer on the substrate 101, which is an SOI substrate, with well-known photolithography and dry etching techniques.

The optical attenuator 113*a* and the optical attenuator 113*b* are current injection type optical attenuators, for example. Such an optical attenuator has, for example, a rib-type optical waveguide structure, which can include a horizontal pin diode with a p-type region and an n-type region interposing the core. This structure can be made by patterning the surface silicon layer on the substrate 101, which is an SOI substrate, with known photolithography and dry etching techniques. The p-type region and the n-type region can be made with an ion implantation technique.

Alternatively, the optical attenuator 113*a* and the optical attenuator 113*b* may each be a heater-loaded Mach-Zehnder interferometer type optical attenuator. The Mach-Zehnder interferometer can be made by patterning the surface silicon layer with known photolithography and dry etching techniques. The heater can be made by patterning with a depositing technique of a metal thin film and photolithography and dry etching techniques for the deposited metal thin film.

In addition, the optical test circuit includes a light emitting diode 105 optically connected to the first optical waveguide 103, and a photodiode 106 optically connected to the second optical waveguide 104.

Figure 2A:
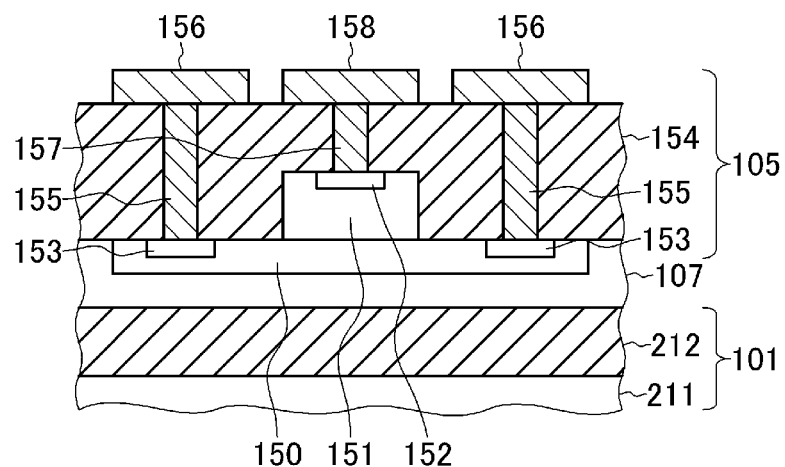
FIG. 2A is a cross-sectional view showing a partial configuration of the optical test circuit according to the first embodiment of the present invention.

A first silicon layer 107, which is continuous with the core of the first optical waveguide 103, is provided on the substrate 101, and the light emitting diode 105 is formed on the first silicon layer 107 (FIG. 2A). Thus, the light emitting diode 105 is formed on the optical waveguide that is continuous with the first optical waveguide 103. For example, the first silicon layer 107 may be formed from the surface silicon layer of the substrate 101 including an SOI substrate.

More particularly, the light emitting diode 105 has: a first region 150 of a first conductivity type, which is formed in the first silicon layer 107; an active layer 151, which is formed on the first region 150 and made of germanium; and a first semiconductor layer 152 of a second conductivity type, which is formed on the active layer 151. The first semiconductor layer 152 may include germanium of the second conductivity type or silicon of the second conductivity type. The first semiconductor layer 152 may also include a silicon germanium mixed crystal layer. For example, the first conductivity type may be p-type and the second conductivity type may be n-type. Alternatively, the first conductivity type may be n-type and the second conductivity type may be p-type.

The light emitting diode 105 has first contact regions 153, into which an impurity of the first conductivity type is introduced at a higher concentration, on both sides of a portion of the first region 150 on which the active layer 151 is formed. An insulation layer 154 is also formed on the first silicon layer 107 so as to embed the active layer 151 therein.

A first through electrode 155, passing through the insulation layer 154, is electrically connected to the first contact region 153, and a first electrode 156, electrically connected to the first through electrode 155, is formed on the insulation layer 154. In addition, a second through electrode 157, passing through the insulation layer 154, is electrically connected to the first semiconductor layer 152, and a second electrode 158, electrically connected to the second through electrode 157, is formed on the insulation layer 154. The first through electrode 155 and the second through electrode 157 each include a metal.

Figure 2B:
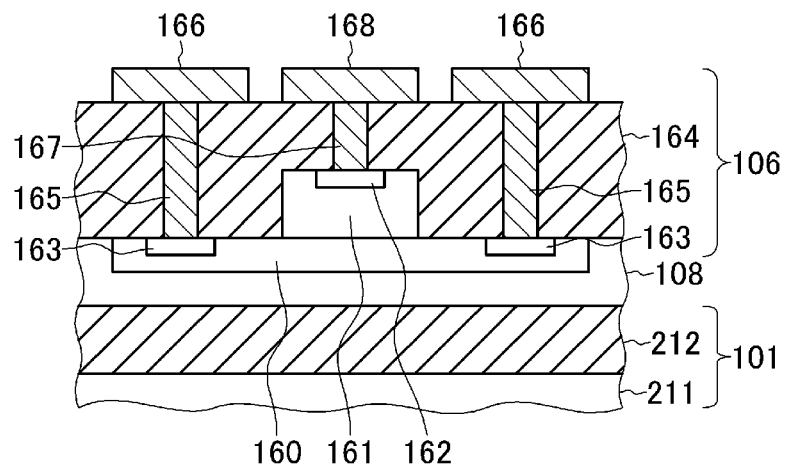
FIG. 2B is a cross-sectional view showing a partial configuration of the optical test circuit according to the first embodiment of the present invention.

A second silicon layer 108, which is continuous with the core of the second optical waveguide 104, is provided on the substrate 101, and the photodiode 106 is formed on the second silicon layer 108 (FIG. 2B). Thus, the photodiode 106 is formed on the optical waveguide that is continuous with the second optical waveguide 104. For example, the second silicon layer 108 may be formed from the surface silicon layer of the substrate 101 including an SOI substrate.

More particularly, the photodiode 106 has: a second region 160 of the first conductivity type, which is formed in the second silicon layer 108; an optical absorption layer 161, which is formed on the second region 160; and a second semiconductor layer 162 of the second conductivity type, which is formed on the optical absorption layer 161. The optical absorption layer 161 may include germanium. The second semiconductor layer 162 may include germanium of the second conductivity type formed in an upper portion of the optical absorption layer 161, or silicon of the second conductivity type formed on the optical absorption layer 161.

The photodiode 106 has second contact regions 163, into which an impurity of the first conductivity type is introduced at a higher concentration, on both sides of a portion of the second region 160 on which the optical absorption layer 161 is formed. An insulation layer 164 is also formed on the second silicon layer 108 so as to embed the optical absorption layer 161 therein.

A third through electrode 165, passing through the insulation layer 164, is electrically connected to the second contact region 163, and a third electrode 166, electrically connected to the third through electrode 165, is formed on the insulation layer 164. In addition, a fourth through electrode 167, passing through the insulation layer 164, is electrically connected to the second semiconductor layer 162, and a fourth electrode 168, electrically connected to the fourth through electrode 167, is formed on the insulation layer 164.

Both the light emitting diode 105 and the photodiode 106 are pin-type germanium diodes having an i-type germanium layer. When a germanium diode is used as a light source (light emitting diode 105), a current is injected in the forward direction. On the other hand, when a germanium diode is used as a photoreceiver (photodiode 106), a bias voltage is applied in the reverse direction, and a current generated through photoelectric conversion of incident light is taken out.

In the optical test circuit according to the first embodiment, the light beams emitted from the light emitting diode 105 are first branched by the optical branch circuit 111, and the respective branched light beams are incident into the optical attenuator 113a and the optical attenuator 113b. The respective light beams emitted from the optical attenuator 113a and the optical attenuator 113b are incident into the optical circuit iota and the optical circuit 102b. The light beams emitted from the optical circuit iota and the optical circuit 102b are multiplexed by the optical multiplex circuit 116. The multiplexed light beam is then output from the second optical waveguide 104, and is incident into the photodiode 106.

For example, assume that the optical attenuator 113a attenuates the light beams passing therethrough and the optical attenuator 113b does not attenuate the light beams passing therethrough. In this case, the light beams that have passed through the optical circuit iota are incident into the photodiode 106. Conversely, assume that the optical attenuator 113a does not attenuate the light beams passing therethrough and the optical attenuator 113b attenuates the light beams passing therethrough. In this case, the light beams that have passed through the optical circuit 102b are incident into the photodiode 106. Thus, when one of the optical attenuator 113a and the optical attenuator 113b is set to provide attenuation and the other is set not to provide attenuation, a ratio of transmission characteristics between the optical circuit iota and the optical circuit 102b can be measured (tested) as a current ratio output from the photodiode 106.

In the above-mentioned optical test circuit, a single light source and a single photodetector are used for a plurality of optical circuits to be tested. When a germanium diode is used as a light emitting diode, individual germanium diodes have different current/photo characteristics. As a result, using a plurality of germanium diodes as the light sources of the optical test circuit leads to larger differences in optical output powers among the light sources, and thus larger errors in the test result. In the first embodiment, the test of two optical circuits is achieved by using the single light emitting diode 105 and branching the light beams emitted from the light emitting diode 105 with the optical branch circuit 111.

As described above, according to the first embodiment, the light emitting diode 105 and the photodiode 106 are provided on the substrate 101 on which the optical circuit iota and the optical circuit 102b to be tested are formed. Such a configuration enables not taking much time to introduce light beams into the optical circuit and to take out light beams output from the optical circuit, and thus the time required for the wafer-level test of the optical circuit can be reduced.

The optical output power of the light emitting diode 105, which is a germanium diode, is on the order of pW, which is smaller than those of common laser diodes. Therefore, to keep the signal intensity ratio between the photocurrent and the dark current of the photodiode 106 large, the bias voltage applied to the photodiode 106 is necessary to be sufficiently small.

Figure 3:
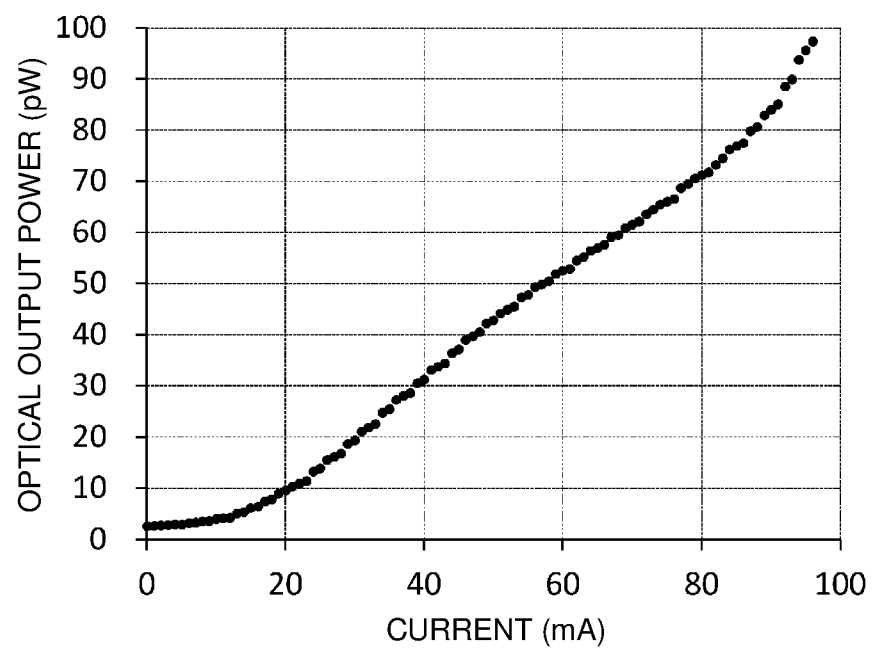
FIG. 3 is a characteristic diagram showing photo/current characteristics of a light emitting diode with an active layer having dimensions in plan view of 8 μm×25 μm.

FIG. 3 shows photo/current characteristics of the light emitting diode 105 with the active layer 151 having dimensions in plan view of 8 μm×25 μm. In this example, an optical output power for a current injection of 100 mA is approximately 100 pW. When the active layer 151 has dimensions in plan view of 40 μm×55 μm, an optical output power of about 1 nW is expected.

Figure 4:
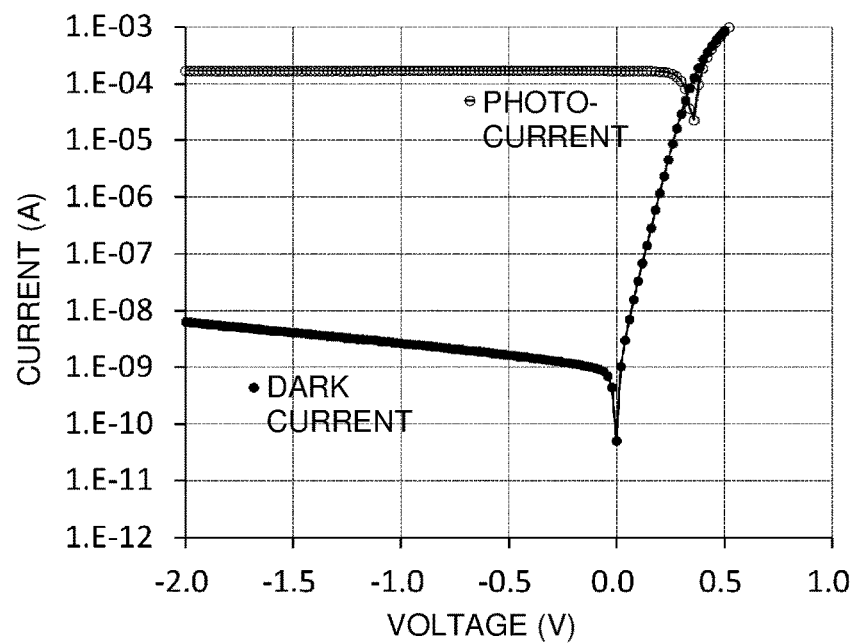
FIG. 4 is a characteristic diagram showing current-voltage characteristics when a germanium diode is used as a photoreceiver.

FIG. 4 shows current-voltage characteristics when a germanium diode is used as a photoreceiver. The photocurrent conversion efficiency is approximately 1 A/W. The dark current at zero bias is about 50 pA. When a branch loss of the optical branch circuit 111 is 3.5 dB, excessive losses of the optical attenuator 113a and the optical attenuator 113b are 1 dB, and insertion losses of the optical circuit iota and the optical circuit 102b are 1 to 10 dB, then a photocurrent from the photodiode 106 ranges from 28 pA to 280 pA, and thus the measurement range required for the test can be obtained.

Second Embodiment

Figure 5:
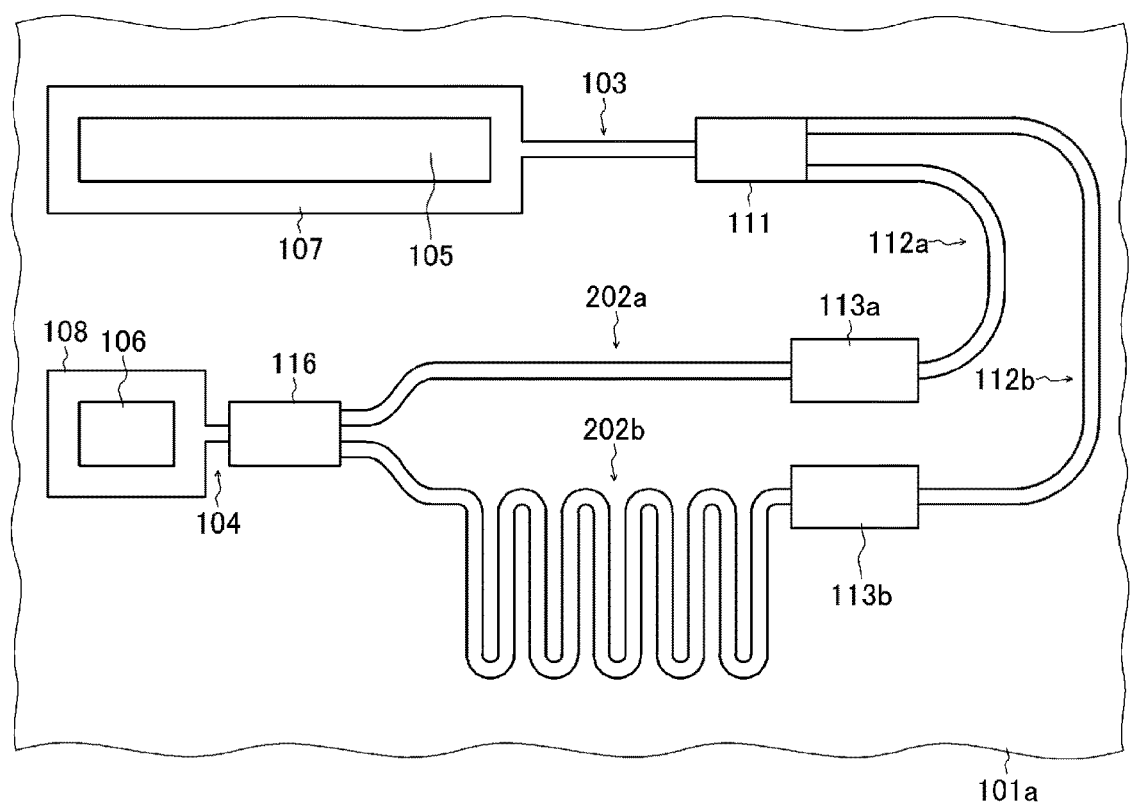
FIG. 5 is a configuration diagram showing a configuration of an optical test circuit according to the second embodiment of the present invention.

Next, an optical test circuit according to the second embodiment of the present invention is described with reference to FIG. 5. This optical test circuit has an optical circuit 202a and an optical circuit 202b formed on a substrate 101a, a first optical waveguide 103 optically connected to the optical circuit 202a and the optical circuit 202b, and a second optical waveguide 104 optically connected to the optical circuit 202a and the optical circuit 202b. The optical circuit 202a is an optical waveguide having a shorter waveguide length, and the optical circuit 202b is an optical waveguide having a longer waveguide length. The optical circuit 202a and the optical circuit 202b can be formed by patterning the surface silicon layer on the substrate 101a with well-known photolithography and dry etching techniques.

Components other than the optical circuit 202a and the optical circuit 202b to be tested are similar to those of the first embodiment described above, and thus detailed description thereof will be omitted.

In the optical test circuit according to the second embodiment, the light beams emitted from the light emitting diode 105 are first branched by the optical branch circuit 111, and the respective branched light beams are incident into the optical attenuator 113a and the optical attenuator 113b. The respective light beams emitted from the optical attenuator 113a and the optical attenuator 113b are incident into the optical circuit 202a and the optical circuit 202b. The light beams emitted from the optical circuit 202a and the optical circuit 202b are multiplexed by the optical multiplex circuit 116. The multiplexed light beam is then output from the second optical waveguide 104, and is incident into the photodiode 106.

For example, assume that the optical attenuator 113a attenuates the light beams passing therethrough and the optical attenuator 113b does not attenuate the light beams passing therethrough. In this case, the light beams that have passed through the optical circuit 202a are incident into the photodiode 106. Conversely, assume that the optical attenuator 113a does not attenuate the light beams passing therethrough and the optical attenuator 113b attenuates the light beams passing therethrough. In this case, the light beams that have passed through the optical circuit 202b are incident into the photodiode 106. Thus, when one of the optical attenuator 113a and the optical attenuator 113b is set to provide attenuation and the other is set not to provide attenuation, a ratio of transmission characteristics between the optical circuit 202a and the optical circuit 202b can be measured (tested) as a current ratio output from the photodiode 106. The losses per unit length of the optical waveguides constituting the optical circuit 202a and the optical circuit 202b can be estimated on the basis of the current ratio.

As described above, also in the second embodiment, the light emitting diode 105 and the photodiode 106 are provided on the substrate 101a on which the optical circuit 202a and the optical circuit 202b to be tested are formed. Such a configuration enables not taking much time to introduce light beams into the optical circuit and to take out light beams output from the optical circuit, and thus the time required for the wafer-level test of the optical circuit can be reduced.

Third Embodiment

Figure 6:
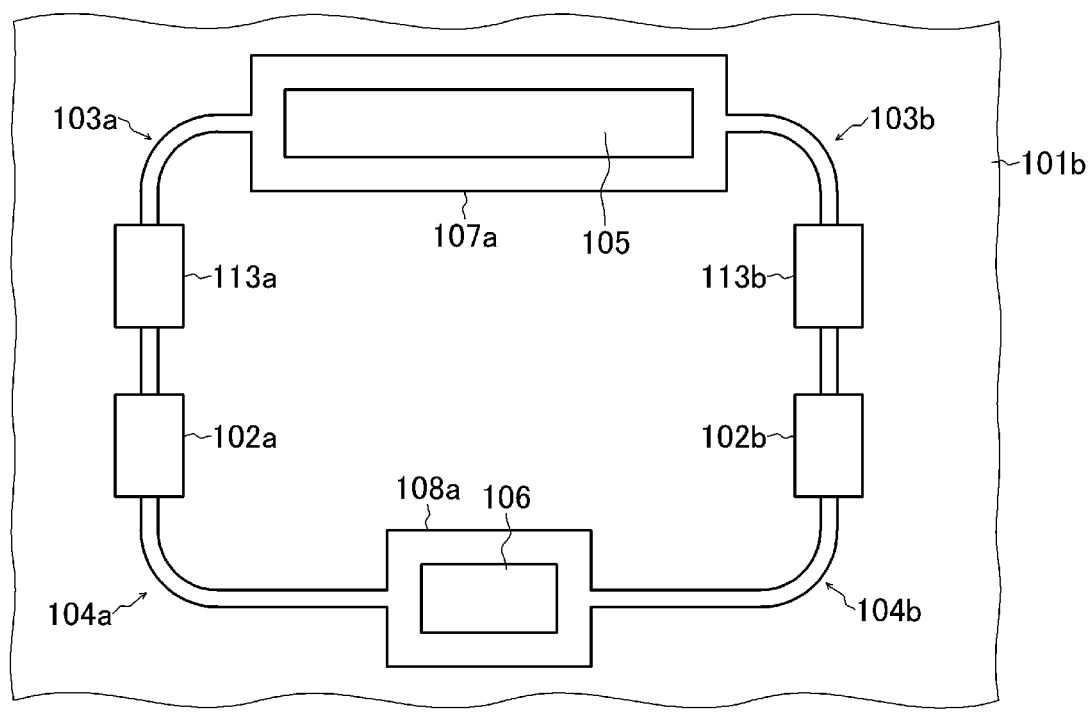
FIG. 6 is a configuration diagram showing a configuration of an optical test circuit according to the third embodiment of the present invention.

Next, an optical test circuit according to the third embodiment of the present invention is described with reference to FIG. 6. This optical test circuit has an optical circuit 102a and an optical circuit 102b formed on a substrate 101b, a first optical waveguide 103a and a first optical waveguide 103b optically connected to the optical circuit iota and the optical circuit 102b respectively, and a second optical waveguide 104a and a second optical waveguide 104b optically connected to the optical circuit iota and the optical circuit 102b respectively.

In addition, the optical test circuit has a light emitting diode 105 optically connected to the first optical waveguide 103a and the first optical waveguide 103b, and a photodiode 106 optically connected to the second optical waveguide 104a and the second optical waveguide 104b. In the third embodiment, neither an optical branch circuit nor an optical multiplex circuit is used. The light emitting diode 105 and the photodiode 106 are similar to those of the first embodiment described above.

In the third embodiment, a first silicon layer 107a, which is continuous with each core of the first optical waveguide 103a and the first optical waveguide 103b, is provided on the substrate 101b, and the light emitting diode 105 is formed on the first silicon layer 107a. In the third embodiment, the light emitting diode 105 is configured to have two output ports. According to the third embodiment, the same optical output power can be output to the first optical waveguide 103a and the first optical waveguide 103b without an optical branch circuit.

In addition, a second silicon layer 108a, which is continuous with each core of the second optical waveguide 104 and the second optical waveguide 104b, is provided on the substrate 101b, and the photodiode 106 is formed on the second silicon layer 108a. In the third embodiment, the photodiode 106 is configured to have two input ports. According to the third embodiment, the light beams output from the optical circuit iota and the optical circuit 102b can be incident into the photodiode 106 without an optical multiplex circuit.

Consequently, according to the third embodiment, the characteristics of the optical circuit iota and the optical circuit 102b can be evaluated individually without an optical multiplex circuit. According to the third embodiment, neither an optical branch circuit nor an optical multiplex circuit is necessary, and thus the circuit configuration can be simplified. In addition, according to the third embodiment, excessive loss of light beams due to an optical branch circuit or an optical multiplex circuit can be eliminated.

Also in the third embodiment, the light emitting diode 105 and the photodiode 106 are provided on the substrate 101b on which the optical circuit iota and the optical circuit 102b to be tested are formed. Such a configuration enables not taking much time to introduce light beams into the optical circuit and to take out light beams output from the optical circuit, and thus the time required for the wafer-level test of the optical circuit can be reduced.

Fourth Embodiment

Figure 7:
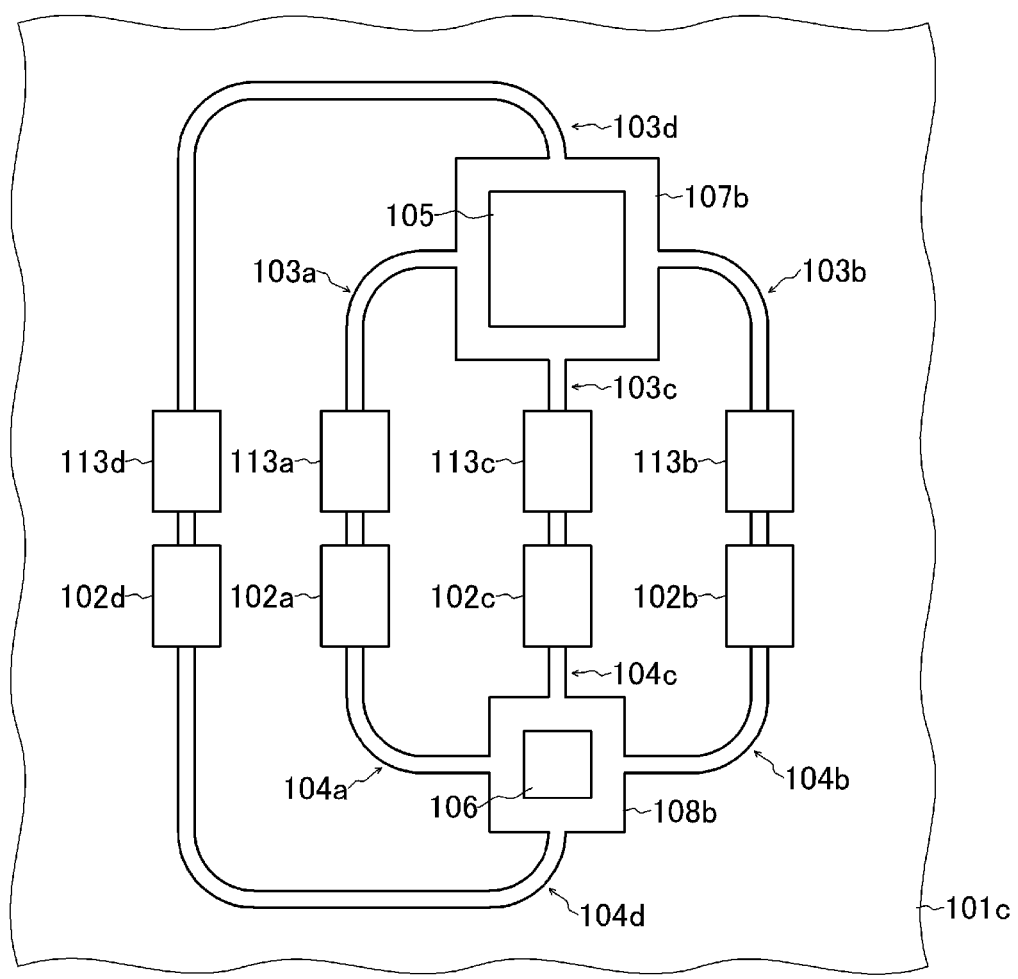
FIG. 7 is a configuration diagram showing a configuration of an optical test circuit according to the fourth embodiment of the present invention.

Next, an optical test circuit according to the fourth embodiment of the present invention is described with reference to FIG. 7. This optical test circuit has an optical circuit 102a, an optical circuit 102b, an optical circuit 102c, and an optical circuit 102d, which are formed on a substrate 101c, and a first optical waveguide 103a, a first optical waveguide 103b, a first optical waveguide 103c, and a first optical waveguide 103d, which are optically connected to the optical circuit iota, the optical circuit 102b, the optical circuit 102c, and the optical circuit 102d, respectively. The optical test circuit also has a second optical waveguide 104a, a second optical waveguide 104b, a second optical waveguide 104c, and a second optical waveguide 104d, which are optically connected to the optical circuit iota, the optical circuit 102b, the optical circuit 102c, and the optical circuit 102d, respectively.

In addition, the optical test circuit has a light emitting diode 105 optically connected to the first optical waveguide 103a, the first optical waveguide 103b, the first optical waveguide 103c, and the first optical waveguide 103d. The optical test circuit also has a photodiode 106 optically connected to the second optical waveguide 104a, the second optical waveguide 104b, the second optical waveguide 104c, and the second optical waveguide 104d. In the fourth embodiment, neither an optical branch circuit nor an optical multiplex circuit is used as in the third embodiment described above. The fourth embodiment additionally includes the optical circuit 102c and the optical circuit 102d, and further includes an optical attenuator 113c and an optical attenuator 113d corresponding to these respective optical circuits. The light emitting diode 105 and the photodiode 106 are similar to those in the first embodiment described above.

In the fourth embodiment, a first silicon layer 107b, which is continuous with each of the core of the first optical waveguide 103a, the core of the first optical waveguide 103b, the core of the first optical waveguide 103c, and the first optical waveguide 103d, is provided on the substrate low, and the light emitting diode 105 is formed on the first silicon layer 107b. In the fourth embodiment, the light emitting diode 105 is configured to have four output ports. According to the fourth embodiment, the same optical output power can be output to the first optical waveguide 103a, the first optical waveguide 103b, the first optical waveguide 103c, and the first optical waveguide 103d, without an optical branch circuit.

In addition, a second silicon layer 108b, which is continuous with each of the core of the second optical waveguide 104, the core of the second optical waveguide 104b, the core of the second optical waveguide 104c, and the second optical waveguide 104d, is provided on the substrate 101c, and the photodiode 106 is formed on the second silicon layer 108b. In the fourth embodiment, the photodiode 106 is configured to have four input ports. According to the fourth embodiment, the light beams output from the optical circuit iota, the optical circuit 102b, the optical circuit 102c, and the optical circuit 102d can be incident into the photodiode 106, without an optical multiplex circuit.

Consequently, according to the fourth embodiment, the characteristics of the optical circuit 101a, the optical circuit 102b, the optical circuit 102c, and the optical circuit 102d can be evaluated individually without an optical multiplex circuit. According to the fourth embodiment, neither an optical branch circuit nor an optical multiplex circuit is necessary, and thus the circuit configuration can be simplified. In addition, according to the fourth embodiment, excessive loss of light beams due to an optical branch circuit or an optical multiplex circuit can be eliminated.

Also in the fourth embodiment, the light emitting diode 105 and the photodiode 106 are provided on the substrate 101c on which the optical circuit iota, the optical circuit 102b, the optical circuit 102c, and the optical circuit 102d to be tested are formed. Such a configuration enables not taking much time to introduce light beams into the optical circuit and to take out light beams output from the optical circuit, and thus the time required for the wafer-level test of the optical circuit can be reduced.

As described above, according to embodiments of the present invention, the light emitting diode with the active layer made of germanium is optically connected to the first optical waveguide, and the photodiode is optically connected to the second optical waveguide. Consequently, light introduction from an optical fiber into an optical circuit is eliminated, and thus the time required for the wafer-level test of the optical circuit can be reduced.

It is apparent that the present invention is not limited to the embodiments described above, and that many modifications and combinations can be made within the technical idea of the present invention by those having ordinary skills in the art.

REFERENCE SIGNS LIST 101 substrate
102a, 102b optical circuit
103 first optical waveguide
104 second optical waveguide
105 light emitting diode
106 photodiode
107 first silicon layer
108 second silicon layer
111 optical branch circuit
112a, 112b optical waveguide
113a, 113b optical attenuator
114a, 114b optical waveguide
115a, 115b optical waveguide
116 optical multiplex circuit
150 first region
151 active layer
152 first semiconductor layer
153 first contact region
154 insulation layer
155 first through electrode
156 first electrode
157 second through electrode
158 second electrode
211 base portion
212 embedded insulation layer

The invention claimed is:

1. An optical test circuit comprising:
an optical circuit including a first optical waveguide on a substrate and having a core made of silicon;
a second optical waveguide having a core made of silicon and being optically connected to the optical circuit;
a first silicon layer on the substrate and continuous with the core of the second optical waveguide;
a third optical waveguide having a core made of silicon and being optically connected to the optical circuit;
a light emitting diode optically connected to the second optical waveguide and having an active layer comprising germanium, wherein the active layer is on the first silicon layer, and wherein the light emitting diode further comprises:
a first region of a first conductivity type in the first silicon layer; and
a first semiconductor layer comprising germanium of a second conductivity type on the active layer, wherein the active layer is on the first region; and
a photodiode optically connected to the third optical waveguide and having an optical absorption layer comprising germanium.

2. The optical test circuit according to claim 1, further comprising a second silicon layer on the substrate and continuous with the core of the third optical waveguide, wherein the optical absorption layer is on the second silicon layer.

3. The optical test circuit according to claim 2, wherein the photodiode further comprises:
a second region of the first conductivity type in the second silicon layer; and
a second semiconductor layer of the second conductivity type on the optical absorption layer, wherein the optical absorption layer is on the second region.

4. The optical test circuit according to claim 3, wherein the second semiconductor layer comprises germanium of the second conductivity type.

5. A method of providing an optical test circuit, the method comprising:

providing an optical circuit including a first optical waveguide on a substrate, the first optical waveguide having a core made of silicon;

optically connecting a second optical waveguide having a core made of silicon to the optical circuit;

forming a first silicon layer on the substrate continuous with the core of the second optical waveguide;

optically connecting a third optical waveguide having a core made of silicon to the optical circuit;

optically connecting a light emitting diode to the second optical waveguide, the light emitting diode having an active layer comprising germanium, wherein the active layer is formed on the first silicon layer, and wherein the light emitting diode further comprises:
- a first region of a first conductivity type formed in the first silicon layer; and
- a first semiconductor layer comprising germanium of a second conductivity type formed on the active layer, wherein the active layer is formed on the first region; and optically connecting a photodiode to the third optical waveguide, the photodiode having an optical absorption layer comprising germanium.

6. The method according to claim 5, further comprising forming a second silicon layer on the substrate continuous with the core of the third optical waveguide, wherein the optical absorption layer is formed on the second silicon layer.

7. The method according to claim 6, wherein the photodiode further comprises:
- a second region of the first conductivity type formed in the second silicon layer; and
- a second semiconductor layer of the second conductivity type formed on the optical absorption layer, wherein the optical absorption layer is formed on the second region.

8. The method according to claim 7, wherein the second semiconductor layer comprises germanium of the second conductivity type.

* * * * *